United States Patent [19]
Hiramatsu et al.

[11] Patent Number: 5,091,705
[45] Date of Patent: Feb. 25, 1992

[54] FM MODULATOR

[75] Inventors: Yonejirou Hiramatsu, Mitaka; Shun-ichi Satou, Kashiwa, both of Japan

[73] Assignee: Sharp Kabushiki Kaisha, Osaka, Japan

[21] Appl. No.: 613,717

[22] PCT Filed: Apr. 6, 1990

[86] PCT No.: PCT/JP90/00473
§ 371 Date: Dec. 5, 1990
§ 102(e) Date: Dec. 5, 1990

[87] PCT Pub. No.: WO90/12451
PCT Pub. Date: Oct. 18, 1990

[30] Foreign Application Priority Data
Apr. 7, 1989 [JP] Japan .................... 1-88325
Jul. 29, 1989 [JP] Japan .................... 1-197775

[51] Int. Cl.⁵ ............................. H03C 3/00
[52] U.S. Cl. .................... 332/103; 332/124; 375/52; 375/67
[58] Field of Search ............. 332/117, 119, 123, 124, 332/103; 375/38, 52, 67

[56] References Cited
U.S. PATENT DOCUMENTS

| | | | |
|---|---|---|---|
| 3,320,552 | 5/1967 | Glasser | 332/119 |
| 3,909,721 | 9/1975 | Bussgang et al. | 375/67 X |
| 3,973,201 | 8/1976 | Andren | 375/67 |
| 4,613,976 | 9/1986 | Sewerinson et al. | 332/103 X |
| 4,726,039 | 2/1988 | Piesinger | 375/67 |

Primary Examiner—Robert J. Pascal

[57] ABSTRACT

A modulation signal is digitally integrated by an integration circuit and then phase-modulated by a phase modulating circuit. The integrated modulation signal is converted in phase modulating circuit to first and second digital modulation signals having phases orthogonal to each other. A carrier signal from a carrier signal generating circuit is converted to first and second carrier signals having phases orthogonal to each other. The first digital modulation signal and the first carrier signal are multiplied in a D/A converter and the second digital modulation signal and the second carrier signal are multiplied in a D/A converter, which multiplications are output as analog signals. These two analog signals are added to an adder to obtain an FM modulation output. As the foregoing, an FM modulation is digitally performed to obtain a highly reliable FM modulator of an excellent linear characteristic without a higher distortion.

10 Claims, 7 Drawing Sheets (a) 4CK
(b) CK0
(c) CK1
(d) CK2
(e) CK3

FIG. 9A
| | Di | CK0 | CK2 | CK3 | D'i |
|---|---|---|---|---|---|
| 0 | L | L | H | H | L |
| 1 | L | H | H | H | L |
| 0 | L | H | L | H | L |
| -1 | L | H | H | L | H |
| 0 | H | L | H | H | L |
| 1 | H | H | H | H | H |
| 0 | H | H | L | H | L |
| -1 | H | H | H | L | L |
(i=0~8)
FIG. 9B
| | D9 | CK0 | CK2 | $\overline{CK1}$ | D'9 |
|---|---|---|---|---|---|
| 0 | L | L | H | L | H |
| 1 | L | H | H | H | L |
| 0 | L | H | L | L | H |
| -1 | L | H | H | L | H |
| 0 | H | L | H | L | H |
| 1 | H | H | H | H | H |
| 0 | H | H | L | L | H |
| -1 | H | H | H | L | L |
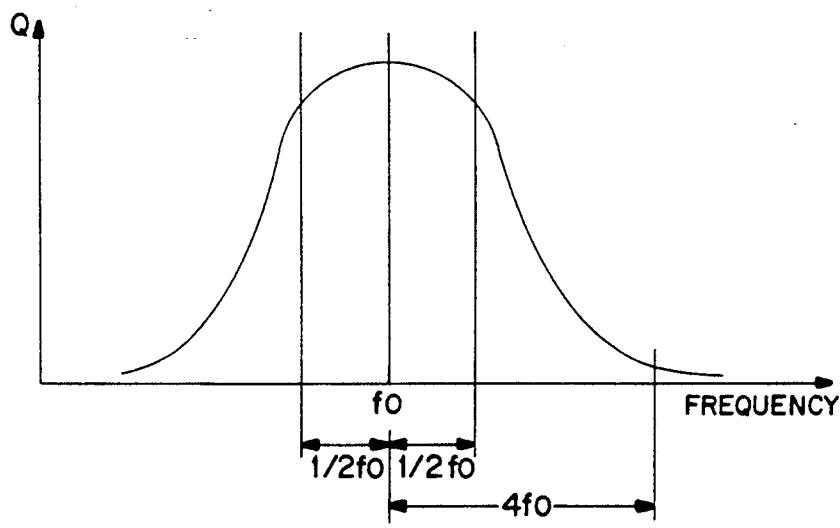
FIG. 10
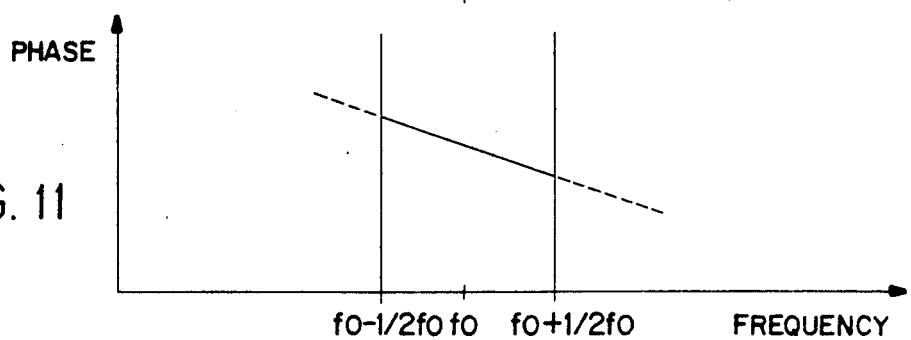
FIG. 11

FM MODULATOR

TECHNICAL FIELD

The present invention relates generally to FM modulators for use in recording video signals and for radio communication, and particularly, to FM modulators for FM-modulating integrated modulation signals by phase-modulating the same.

BACKGROUND ART

Video signals are ordinarily recorded on optical discs and magnetic tapes after being FM modulated once.

Such a multivibrator system modulator as shown in FIG. 1 and a frequency converting system modulator as shown in FIG. 2 are well known as FM modulators for use in such a case as described above.

The FM modulator shown in FIG. 1 has a pair of transistors 1 and 2. A video signal as a modulation signal is supplied in common to a base terminal 3 of transistors 1 and 2. Then, an FM modulated output is obtained from an output terminal 4.

The FM modulator shown in FIG. 2 includes an FM modulator 6 having a center frequency of f1 and an FM modulator 7 having a center frequency of f2. The frequencies of the FM modulated outputs of FM modulators 6 and 7 are mixed by a frequency converter 8. Extracted by a low pass filter 9 is a frequency of the difference (f1−f2) of the FM modulated outputs after the frequency mixing. FM modulators 6 and 7 are structured to have frequency deviation directions opposite to each other. That is, FM modulators 6 and 7 are structured such that when one FM modulation frequency is increased with respect to the positive input, the other FM modulation frequency is decreased. Consequently, the frequency of the difference (f1−f2) which is the ultimate FM modulated output has become in practice a frequency of the sum of the center frequencies f1 and f2.

Such FM modulators as shown in FIGS. 1 and 2 are structured to process modulation signals in a purely analog manner, thereby causing the following problems (1)-(4).

(1) A frequency relation between an input voltage and an output voltage is non-linear.

(2) An FM modulation output signal includes a higher distortion (especially secondary distortion).

(3) An oscillating frequency is not stabilized, particularly due to a temperature characteristic.

(4) A modulated signal is leaked to an output side.

Various adjustments and condensors are required to improve the above-described problems, even by which it is difficult to obtain sufficient precision.

Therefore, the object of the present invention is to provide a highly reliable FM modulator of high precision causing none of such problems as described above.

SUMMARY OF THE PRESENT INVENTION

A first FM modulator according to the present invention includes integration means for converting an analog modulation signal to a digital integration output, carrier signal generating means for generating a carrier signal and phase modulating means for phase-modulating the output of the integration means in response to the carrier signal. The phase modulating means includes digital modulation signal outputting means, carrier signal converting means, first and second D/A converting means with a multiplication function, and operation means. The digital modulation signal outputting means outputs first and second digital modulation signals having phases orthogonal to each other based on the output of the integration means. The carrier signal converting means converts a carrier signal to first and second carrier signals having phases orthogonal to each other. The first D/A converting means with multiplication function receives the first digital modulation signal and the first carrier signal to output an analog signal corresponding to the multiplication result of the first digital modulation signal and the first carrier signal. The second D/A converting means with multiplication function receives the second digital modulation signal and the second carrier signal to output an analog signal corresponding to the multiplication result of the second modulation signal and the second carrier signal. The operation means adds or subtracts the outputs of the first and the second D/A converting means with multiplication function.

A second FM modulator according to the present invention includes integration means for converting an analog modulation signal to a digital integration output, a digital carrier signal group generating means for generating a digital carrier signal group having four digital carrier signals each out of phase by $\pi/2$ to one another, and phase modulating means for phase-modulating the output of the integration means in response to the digital carrier signal group. The phase-modulating means includes a digital modulation signal outputting means, a digital carrier signal group converting means, first and second multiplication means and operation means. The digital modulation signal outputting means outputs first and second digital modulation signals having phases orthogonal to each other in response to the output of the integration means. The digital carrier signal group converting means converts the digital carrier signal group to first and second digital carrier signal groups having phases orthogonal to each other. The first multiplication means multiplies the first digital modulation signal by the first digital carrier signal group. The second multiplication means multiplies the second digital modulation signal by the second digital carrier signal group. The operation means adds or subtracts the outputs of the first and the second multiplication means.

In the above-described first and second FM modulators according to the present invention, an analog modulation signal is digitally processed to be FM-modulated. Therefore, a linear characteristic thereof is excellent, no higher distortion is included and furthermore, a temperature characteristic is improved.

In addition, in the second FM modulator according to the present invention, the arrangement of the multiplication means is simplified by using the carrier signal group having four digital carrier signals each out of phase by $\pi/2$ to one another.

BRIEF DESCRIPTION OF THE DRAWINGS

FIGS. 9A and 9B are diagrams showing a logic relation between the input and the output of the digital multiplier for use in the embodiment shown in FIG. 6.

FIG. 10 is a graph showing a band characteristic of a band pass filter for use in the embodiment shown in FIG. 6.

FIG. 11 is a diagram showing a phase characteristic of the band bass filter for use in the embodiment shown in FIG. 6.

DETAILED DESCRIPTION OF THE PRESENT INVENTION

For a more detailed disclosure, the present invention will be described with reference to the attached drawings.

Figure 3:
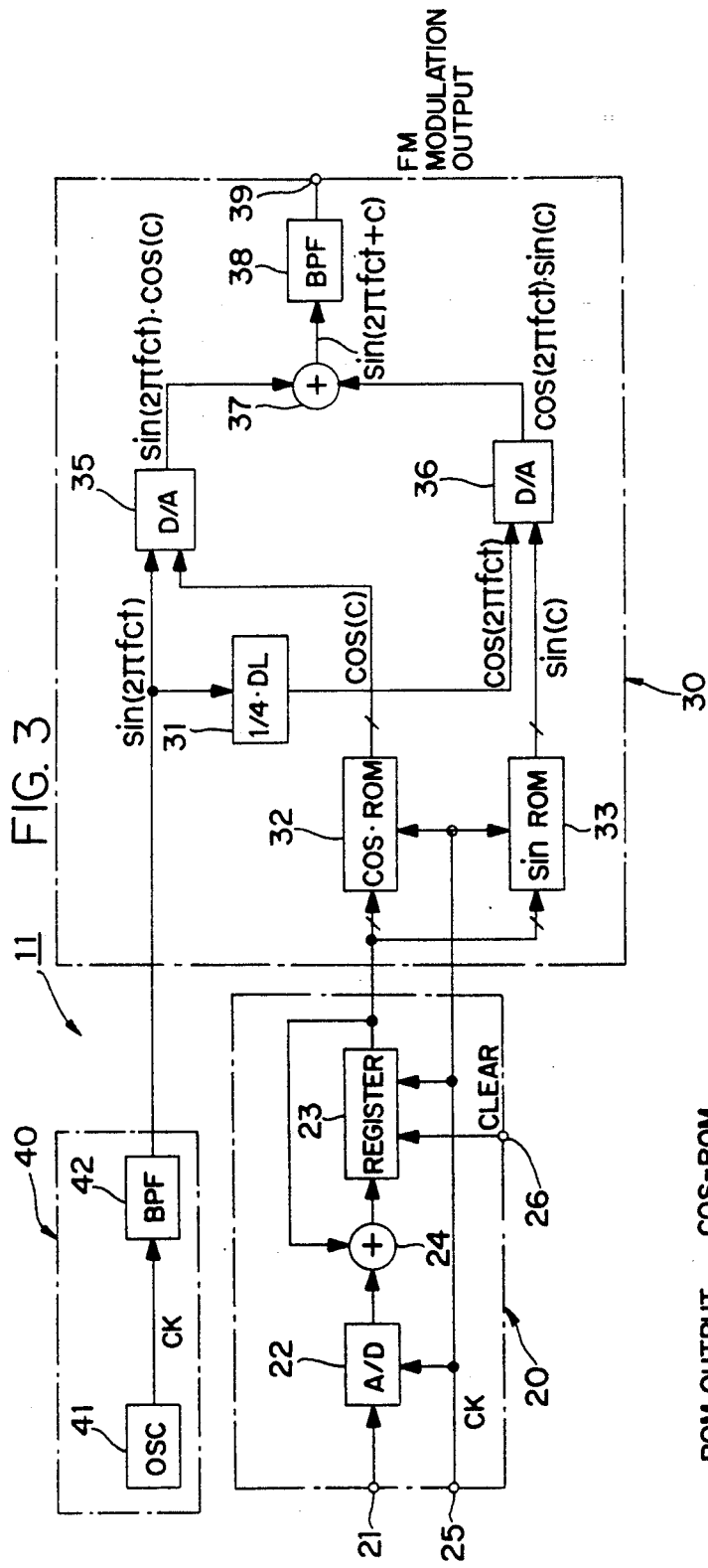
FIG. 3 is a block diagram showing an arrangement of a first embodiment of the present invention.
Figure 4:
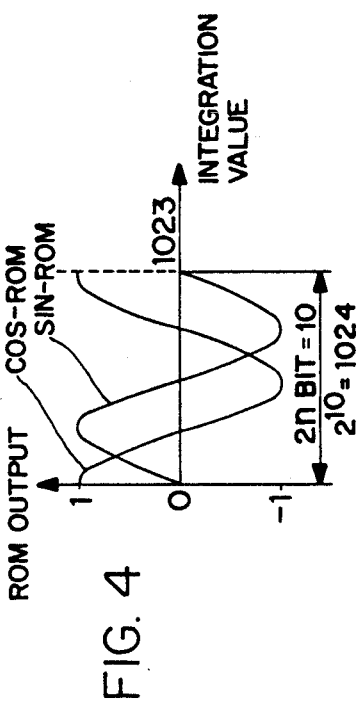
FIG. 4 is a graph showing a relation between the input and the output of the waveform converting ROM shown in FIG. 3.

FIG. 3 is the block diagram showing the arrangement of the FM modulator according to the first embodiment of the present invention. In the drawing, an FM modulator 11 of FIG. 3 comprises an integration circuit 20, a phase modulating circuit 30 and a carrier signal generating circuit 40. Integration circuit 20 integrates the analog modulation signal supplied to an input terminal 21. For example, a video signal can be used as an analog modulation signal. Phase modulating circuit 30 phase-modulates the integration output of integration circuit 20 in response to the carrier signal applied from carrier signal generating circuit 40.

FM modulator 11 of FIG. 3 is structured to digitally process the analog modulation signal supplied to input terminal 21. Thus, integration circuit 20 has an A/D converter 22 which converts the analog modulation signal (a video signal of a still picture in the present embodiment) supplied to input terminal 21 to a digital signal having a predetermined number of bits (8 bits in the present embodiment). The digitalized video signal is added in an adder 24 to a video signal one clock before outputted from a register 23. Adder 24 comprises 2n (n is a positive integer) bits. In the present embodiment, it is assumed that n=5. Therefore, the least significant 8 bits of adder 24 receive the 8-bit video signal as input to and the remaining 2 bits receive no input. Then, the output (comprising 10 bits) of adder 24 is again supplied to register 23.

As the foregoing, by sequential adding video signal one block before, an integrated digital video signal is obtained from register 23.

As the clock signal CK for use in A/D converter 22 and register 23, employed is an output from a reference oscillator 41 included in carrier signal generating circuit 40. Reference oscillator 41 comprises a crystal oscillator or the like. In the present embodiment, a still picture video signal having a time base extended by a factor of 15 is FM-modulated, 2.5 MHz is used as a clock frequency fc of reference oscillator 41. The clock signal CK is supplied from an input terminal 25.

A clear signal is supplied to an input terminal 26 provided for register 23. The clear signal initializes the contents of register 23. This takes into consideration also that a video signal having a direct component lost is supplied to input terminal 21. That is, even if the supplied video signal includes no direct current component, an initial value of register 23 is fixed by resetting the contents of register 23 for each horizontal cycle at a tip portion of a horizontal synchronizing signal. Therefore, an integration value at a level of the tip of the synchronizing signal can be fixed.

Figure 1:
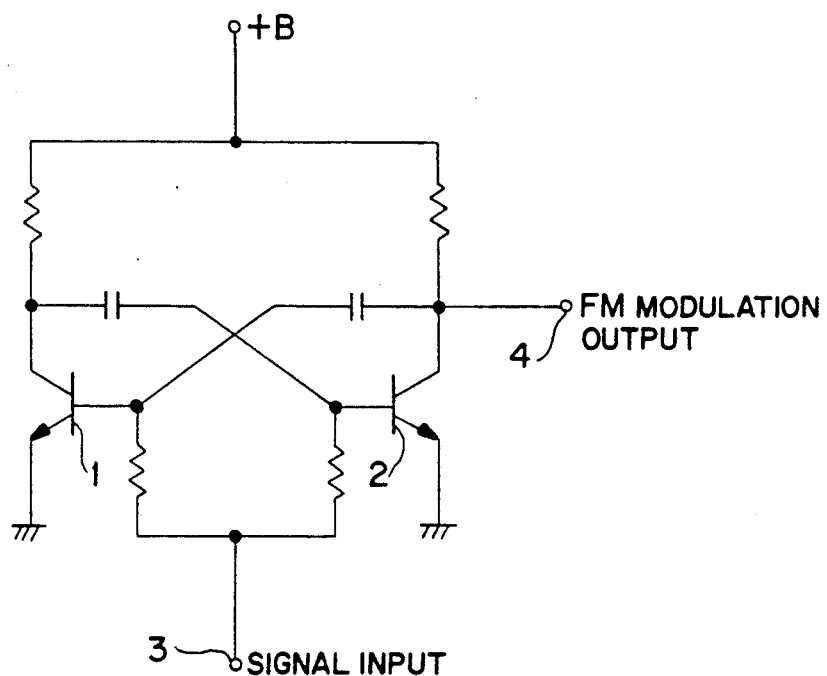
FIG. 1 is a circuit diagram showing an arrangement of a conventional multivibrator system FM modulator.
Figure 2:
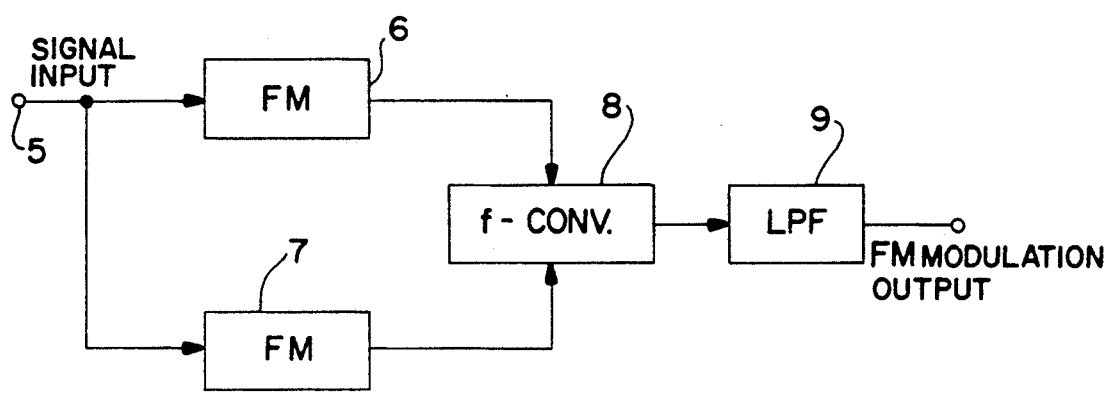
FIG. 2 is a schematic block diagram showing an arrangement of a conventional frequency converting system FM modulator.

The video signal digitally integrated in integration circuit 20 is supplied to phase modulating circuit 30. Phase modulating circuit 30 is provided with first and second waveform converting ROMs 32 and 33. The first and the second waveform converting ROMs 32 and 33 convert the input digital video signals (integration output) to two digital video signals having phases orthogonal to each other. That is, first and second waveform converting ROMs 32 and 33 store an amplitude value (digital signal) corresponding to a cosine wave and an amplitude value (digital signal) corresponding to a sine wave as shown in FIG. 2, respectively. In first and second waveform converting ROMs 32 and 33, amplitude values corresponding to the level of the input digital video signal are simultaneously referred to output two digital video signals having phases orthogonal to each other, that is, a cosine digital video signal cos(c) and a sine digital video signal sin(c). Herein, the above-described phase c corresponds to the level of the input digital video signal (the level of the integration output). The cosine digital video signal cos(c) and the sine digital video signal sin(c) are used as modulation signals as will be described later.

The cosine digital video signal cos(c) is supplied to a first D/A converter 35 comprising 2n bits. The sine digital video signal sin(c) is supplied to a second D/A converter 36 comprising 2n bits. First and second D/A converters 35 and 36 receive the supply of analog carrier signals from carrier signal generating circuit 40 in addition to the digital video signals.

In carrier signal generating circuit 40, the reference clock signal CK from reference oscillator 41 is supplied once to a band pass filter 42 wherein the signal is converted to a sine wave signal $\sin(2\pi fct)$ having the same frequency as that of the reference clock signal CK. Herein, $\pi$ is a ratio of the circumference of a circle to its diameter and t is a time (the same hereinafter).

The sine wave signal $\sin(2\pi fct)$ is supplied to a ¼ cycle delay circuit 31 wherein the signal is delayed by ¼ cycle. As a result, the sine wave signal $\sin(2\pi fct)$ is converted to a cosine wave signal $\cos(2\pi fct)$. By using such a ¼ cycle delay circuit 31, the sine wave signal $\sin(2\pi fct)$ can be converted to first and second carrier signals having phases orthogonal to each other. Herein, the first carrier signal is a sine carrier signal $\sin(2\pi fct)$ and the second carrier signal is a cosine carrier signal $\cos(2\pi fct)$.

The sine carrier signal $\sin(2\pi fct)$ and the cosine digital video signal cos(c) are supplied to first D/A converter 35. The cosine carrier signal $\cos(2\pi fct)$ and the sine digital video signal sin(c) are supplied to second D/A converter 36. First and second D/A converters 35 and 36 are D/A converters having four quadrant multiplication function. In other words, first and second D/A converters 35 and 36 are structured to have output amplitudes controlled by an input carrier signal when an input digital video signal is converted to an analog signal. For example, DAC-7533, the product of DATEL Corporation is used as such D/A converters 35 and 36.

Therefore, first D/A converter 35 outputs such an analog signal as expressed by the following equation (1).

$$\sin(2\pi fct) \cdot \cos(c) \quad (1)$$

Second D/A converter 36 outputs such an analog signal as expressed by the following equation (2).

$$\cos(2\pi fct) \cdot \sin(c) \quad (2)$$

The output of first D/A converter 35 and the output of second D/A converter 36 are applied to an analog adder 37 wherein they are added. The output of analog adder 37 will be expressed by the following equation (3).

$$\sin(2\pi fct) \cdot \cos(c) + \cos(2\pi fct) \cdot \sin(c) = \sin(2\pi fct + c) \quad (3)$$

As the foregoing, analog adder 37 outputs a sine carrier signal $\sin(2\pi fct + c)$ with a phase lead of c over the sine carrier signal $\sin(2\pi fct)$. The sine carrier signal $\sin(2\pi fct + c)$ is band-limited by a band pass filter 38 and then output from an output terminal 39.

The sine carrier signal $\sin(2\pi fct + c)$ thus obtained at output terminal 39 is a signal of which phase changes at a high speed (1/fc = 400 nsec) for every cycle of a carrier signal in response to an amplitude of an input video signal for the carrier signal. This means that FM modulation is carried out consequently.

Phase resolutions of the above-described sine carrier signal $\sin(2\pi fct)$ and cosine carrier signal $\cos(2\pi fct)$ input to first and second D/A converters 35 and 36 depend on the bit arrangements of first and second D/A converters 35 and 36. For example, assuming that first and second D/A converters 35 and 36 each comprise 10 bits, the phase resolution is 0.35° (= 360° ÷ 1023).

The relation between a minimum phase change dc and a frequency change df per unit time will be expressed by the following equation (4).

$$df = (\tfrac{1}{2}\pi)(dc/dt) \quad (4)$$

The relation between a minimum phase change dc and a maximum frequency deviation Δf will be accordingly expressed by the following equation (5).

$$\Delta f = df (2^8 - 1) \quad (5)$$

Thus, when $$dc = 6.14 \times 10^{-3} \, rad \quad (6)$$

$$dt = 400 \, nsec \, (= 1/fc = 2.5 \, MHz) \quad (7)$$

it can be shown as follows:

$$\Delta f = 0.623 \, MHz \quad (8)$$

$$df = 2443 \, Hz \quad (9)$$

wherein a completely linear relation is established between the input voltage and the output frequency. That is, a linear characteristic is obtained.

In the embodiment shown in FIG. 3, it is assumed that the carrier frequency fc is set to 2.5 MHz which is set to a level of a tip of a synchronization signal of a video signal. In addition, the maximum frequency deviation ΔF is set to 0.623 MHz and a frequency is modulated to become higher.

As described above, in the embodiment of FIG. 3, FM modulation is carried out through a digital processing of operating a carrier signal for every cycle. As a result, it is possible to achieve an FM modulator having a more excellent linear characteristic and temperature characteristic than those of a conventional analogue system FM modulator and having no higher distortion.

Figure 5:
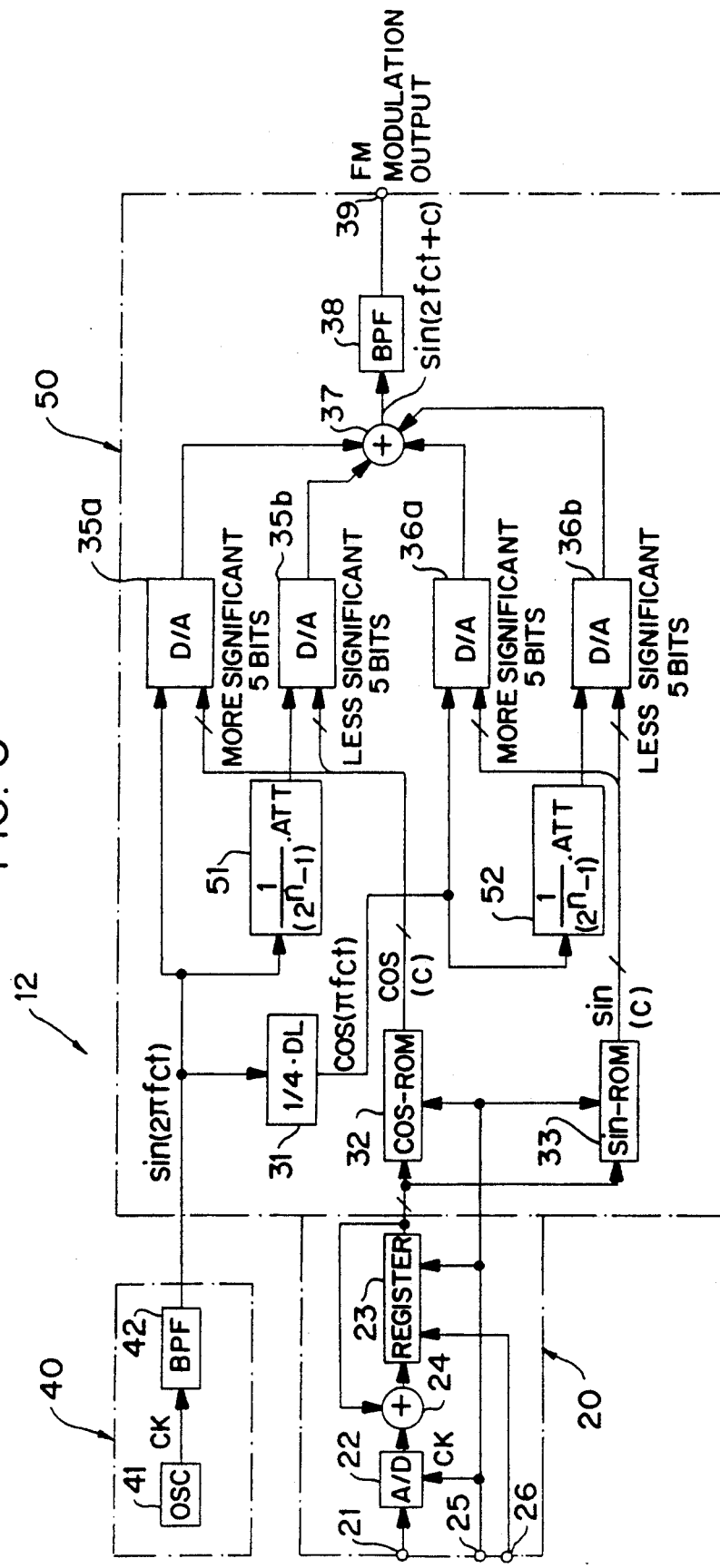
FIG. 5 is a block diagram showing an arrangement of a second embodiment of the present invention.

FIG. 5 is the block diagram showing the arrangement of the second embodiment of the present invention. An FM modulator 12 shown in FIG. 5 has the same arrangement as that of the FM modulator 11 shown in FIG. 3 except for the following points and the same reference numerals are allotted to the corresponding parts, and therefore no description of which will be made here. FM modulator 12 shown in FIG. 5 is provided with a phase modulating circuit 50 having a different arrangement from that of phase modulating circuit 30 in FM modulator 11 of FIG. 3. Phase modulating circuit 50 comprises four D/A converters 35a, 35b, 36a and 36b. Each of D/A converters 35a, 35b, 36a and 36b comprises 5 bits and has a four quadrant multiplication function. The more significant 5 bits out of 10 bits of the cosine digital video signal cos(c) are supplied to D/A converter 35a and the less significant 5 bits are supplied to D/A converter 35b. The more significant 5 bits out of 10 bits of the sine digital video signal sin(c) are supplied to D/A converter 36a and the less significant 5 bits are supplied to D/A converter 36b. The cosine carrier signal $\sin(2\pi fct)$ is supplied to D/A converter 35a and the cosine carrier signal $\cos(2\pi fct)$ is supplied to D/A converter 36a. The sine carrier signal $\sin(2\pi fct)$ having the level attenuated to $1/(2^n - 1)$ by an attenuator 51, is supplied to D/A converter 35b. The cosine carrier signal $\cos(2\pi fct)$ having the level attenuated to $1/(2^n - 1)$ by an attenuator 52, is supplied to D/A converter 36b. Each output of D/A converters 35a, 35b, 36a and 36b is supplied to an analog adder 37 wherein an addition of the same is carried out. The arrangements of other parts in phase modulating circuit 50 are the same as those of phase modulating circuit 30 in FIG. 3.

When a maximum amplitude of a carrier signal is resolved by n bit, that is, by 5 bits, a minimum resolution width corresponds to $1/(2^5 - 1)$ of the maximum amplitude of the carrier signal. Thus, it results in that the minimum resolution width of D/A converter 35a is further resolved by 5 bits by means of attenuator 51 and D/A converter 35b. As a result, the pair of D/A converters 35a and 35b and attenuator 51 as a whole function as a D/A converter of 2n bits. Similarly, the pair of D/A converters 36a and 36b and attenuator 52 as a whole function as a D/A converter of 2n bits.

As the foregoing, the embodiment shown in FIG. 5 employing the D/A converter comprising 5 bits can be manufactured at an extremely reduced cost as compared with the embodiment shown in FIG. 3 employing the D/A converter comprising 10 bits.

The present invention is not limited to the above-described embodiments shown in FIGS. 3 and 5. For example, a sine wave signal and a cosine wave signal are exchangeable in the above-described embodiments of FIGS. 3 and 5 to have completely the same effect because the sine wave signal and the cosine wave signal are completely the same signals except that they are out of phase by ¼ cycle.

Multiplication can be performed between sine waves or cosine waves in D/A converters 35, 36, 35a, 35b, 36a and 36b.

Furthermore, analog adder 37 can perform a subtraction in place of an addition.

Since D/A converters 35, 36, 35a, 35b, 36a and 36b in the embodiments of FIGS. 3 and 5 require a processing of digital video signals based on analog carrier signals of a sine wave or a cosine wave, they cannot be comprised of only simple logic circuits for logic operations of digital signals, which makes circuit arrangements complicated.

A further embodiment of the present invention will be described in the following with reference to the drawings, in which embodiment such problems as described above are improved.

Figure 6:
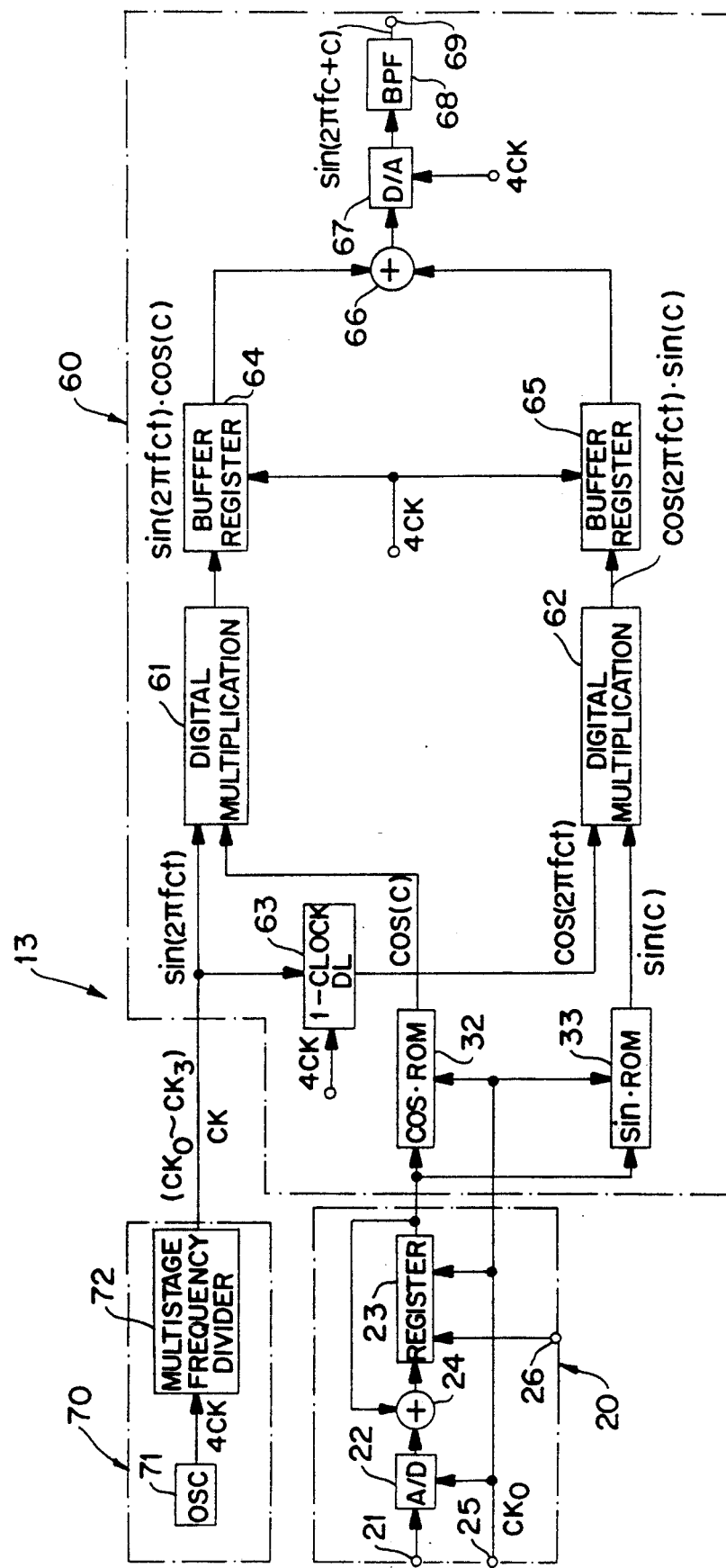
FIG. 6 is a block diagram showing an arrangement of a third embodiment of the present invention.

FIG. 6 is the block diagram showing the arrangement of the third embodiment of the present invention. An FM modulator 13 of FIG. 6 comprises an integration circuit 20, a phase modulating circuit 60 and a carrier signal generating circuit 70. The arrangement of integration circuit 20 is the same as that of integration circuit 20 in the embodiments of FIGS. 3 and 5. A video signal digitally integrated in integration circuit 20 is supplied to phase modulating circuit 60. Phase modulating circuit 60 is provided with first and second waveform converting ROMs 32 and 33 having the same arrangements of the embodiments shown in FIGS. 3 and 5. First waveform converting ROM 32 converts the output of integration circuit 20 to a cosine digital video signal cos(c) and second waveform converting ROM 33 converts the output of integration circuit 20 to a sine digital video signal sin(c). The phase (c) corresponds to the level of the input digital video signal (the output of integration circuit 20).

The above-described cosine digital video signal cos(c) and the sine digital video signal sin(c) are supplied to first and second digital multipliers 61 and 62 each comprising 2n bits. First and second digital multipliers 61 and 62 receive a supply of a digital carrier signal group CK (CK0–CK3) from carrier signal generating circuit 70 in addition to digital video signals.

Figure 7:
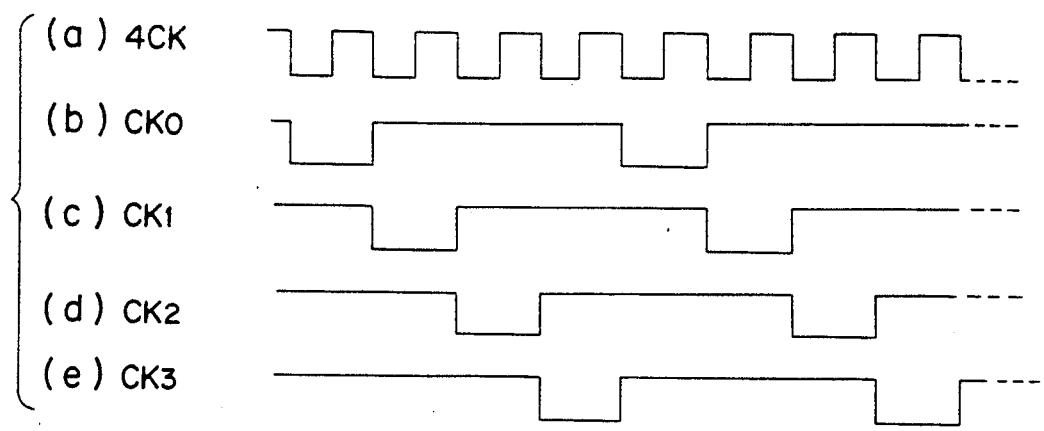
FIG. 7 is a timing chart showing a carrier signal for use in the embodiment shown in FIG. 6.

Carrier signal generating circuit 70 includes a reference oscillator 71 and a multi-stage frequency divider 72. Reference oscillator 71 comprises a crystal oscillator, for example, and an oscillating frequency thereof is selected to have a frequency four times those of reference oscillators 41 in the embodiments of FIGS. 3 and 5, that is, set to 2.5×4=10.0 MHz. Multi-stage frequency divider 72 converts the reference clock signal 4CK from reference oscillator 71 (see FIG. 7(a)) to four digital carrier signals CK0–CK3 (see FIGS. 7(b)–(e)) each out of phase by π/2 one another. Each of the digital carrier signals CK0–CK3 has one-fourth the frequency of the reference clock signal 4CK. Multi-stage frequency divider 72 comprises four frequency dividers each for ¼ frequency-dividing the reference clock signal 4CK.

Assuming now that the digital carrier signal CK0 has a reference phase, the digital carrier signals CK1, CK2 and CK3 are out of phase by π/2, 2π/2 and 3π/2 from the digital carrier signal CK0, respectively. Assuming that the digital carrier signal CK0 at a H (logical high) level is defined as the state 1, the digital carrier signal CK1 at a H level is defined as the state 0, the digital carrier signal CK2 at a H level is defined as the state −1 and the digital carrier signal CK3 at a H level is defined as the state 0, the analog signal having an amplitude repeatedly changing in the order of state 0→state 1→state 0→state −1 can be expressed by these digital carrier signals CK0–CK3. The analog signal is a carrier signal obtained by analogizing a digital carrier signal. That is, the above-described respective states correspond to the amplitude values of the sine wave signal sin(2πfct) having the same frequency as that of the carrier signal CK0 at phases 0, π/2, 2π/2 and 3π/2, respectively. One sine wave signal sin(2πfct) can be therefore expressed by the four digital carrier signals CK0–CK3. In the following description, the four digital carrier signals CK0–CK3 are referred to as sine digital carrier signals sin(2πfct).

The digital carrier signal CK0 having a reference phase is used as a clock signal for use in an A/D converter 22, a register 23 and first and second waveform converting ROMs 32 and 33. The digital carrier signal CK0 is supplied through an input terminal 25.

The four digital carrier signals CK0–CK3 forming the sine digital carrier signal sin(2πfct) are supplied to a one-clock delay circuit 63 comprising a register, for example. In one-clock delay circuit 63, each of the four digital carrier signals CK0–CK3 is delayed by one clock (¼ cycle). The delay amount corresponds to π/2 in phase, so that one-clock delay circuit 63 outputs a cosine digital carrier signal CKc {=cos(2πfct)}. That is, with one-clock delay circuit 63 provided, the digital carrier signal group CK is converted to a first digital carrier signal group {sine digital carrier signal sin(2πfct)} and a second digital carrier signal group {cosine digital carrier signal cos(2πfct)} which phases are orthogonal to each other.

The sine digital carrier signal sin(2πfct) and the cosine digital video signal cos(c) are supplied to first digital multiplier 61 and the cosine digital carrier signal cos(2πfct) and the sine digital video signal sin(c) are supplied to second digital multiplier 62.

A multiplication of first digital multiplier 61 will be described. For a multiplication of four quadrant by using the four digital carrier signals CK0–CK3 as sine digital carrier signals, the following logic operation is carried out by using the most significant bit signal D9 of the cosine digital video signal cos(c) as a sign bit signal.

| state | input | output |
| --- | --- | --- |
| 0 | positive or negative | output positive at any time |
| 1 | positive or negative | output the input without conversion |
| −1 | positive | output the negative inversion of the input |
| −1 | negative | input the positive inversion of the output |

Such a multiplication can be performed by a simple logic circuit.

Figure 8:
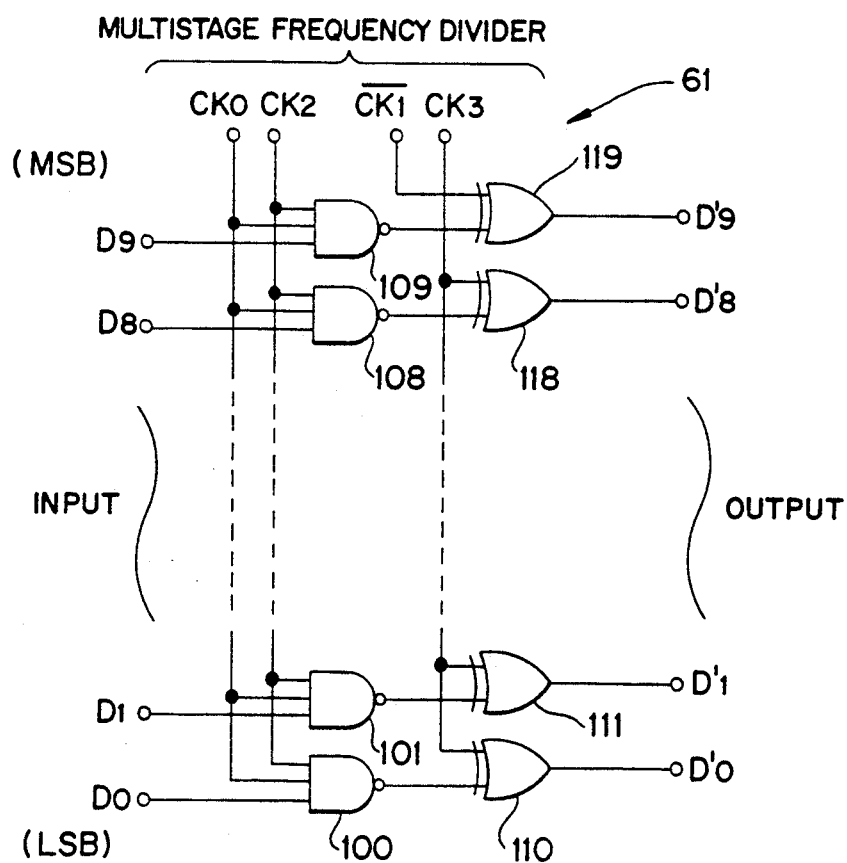
FIG. 8 is a logic gate diagram showing the arrangement of the digital multiplier for use in the embodiment of FIG. 6.

FIG. 8 is the logic circuit diagram showing one example of the arrangement of first digital multiplier 61 shown in FIG. 6. It is pointed out that second digital multiplier 62 has the same arrangement as that of FIG. 8. In FIG. 8, first digital multiplier 61 comprising 10 bits includes ten NAND gates 100–109 and ten exclusive OR gates 110–119. Bit signals D0–D9 forming the multiplication digital video signal cos(c) having 10 bits are applied to the corresponding NAND gates 100–109, respectively. The digital carrier signals CK0 and CK2 are applied in common to NAND gates 100–109. The outputs of NAND gates 100-109 are applied to the corresponding exclusive OR gates 110-119, respectively. The digital carrier signal CK3 is applied in common to the exclusive OR gates 110-118 except the exclusive OR gate 119 corresponding to the most significant bit signal. The most significant bit signal D9 is a sign bit signal and the corresponding exclusive OR gate 119 receives an inversion signal of the digital carrier signal CK1.

FIGS. 9A and 9B show a logic relation between the input and the output of such first digital multiplier 61 as shown in FIG. 8. FIG. 9A shows a logic relation between the input bit signals D0-D8 and the output bit signals D0'-D8'. The upper columns of FIG. 9A show the logic of the output bit signal Di' when the input bit signal Di (i=0-8) is at a low level (this level is assumed to be a logic 0). The lower columns of FIG. 9A show the logic of the output bit signal Di' when the input bit signal Di is at a H level (this level is assumed to be a logic 1). As indicated in FIG. 9A, the output bit signal Di' attains a L level in the state 0 irrespective of the logic of the input bit signal Di. In the state 1, the input is output without conversion. In the state $-1$, the input is inverted to be output.

FIG. 9B shows the logic relation between the input bit signal D9 and the output bit signal D9'. In FIG. 9B, it is assumed that "L" denotes $(-)$ and "H" denotes $(+)$.

Now it is assumed that a zero point of an analog carrier signal (sine wave signal) is denoted as "0 (=1000000000)", a minimum value thereof is denoted as "$-512$ (=0000000000)" and a maximum value is "$+511$ (=1111111111)". In this case, the multiplication output at the state 0 is zero, so that not (0000000000) but (1000000000) should be output. That is, the output bit signal D9' should attain a H level. First digital multiplier 61 has a logic allowing the above. As is clear from FIG. 9B, in the state 1, the input bit signal D9 is output without conversion and in the state $-1$, the input bit signal D9 is inverted to be output.

As described previously, second digital multiplier 65 also has the same arrangement as that of first digital multiplier 61 and therefore no description will be made thereof.

As described in the foregoing, first and second digital multipliers 61 and 62 can be constituted by simple logic circuits only. First and second digital multipliers 61 and 62 attain digital multiplication outputs of a sine signal and a cosine signal, respectively.

First digital multiplier 61 therefore outputs the digital signal expressed by the following equation (11).

$$\sin(2\pi fct)\cdot\cos(c) \qquad (11)$$

Second digital multiplier 62 outputs the digital signal expressed by the following equation (12).

$$\cos(2\pi fct)\cdot\sin(c) \qquad (12)$$

The outputs of first and second digital multipliers 61 and 62 are applied to a digital adder 66 through buffer registers 64 and 65, respectively. Digital adder 66 outputs the digital signal expressed by the following equation (13) by adding the output of first digital multiplier 61 and the output of second digital multiplier 62.

$$\sin(2\pi fct)\cdot\cos(c) + \cos(2\pi cft)\cdot\sin(c) = \sin(2\pi cft + c) \qquad (13)$$

As described above, digital adder 66 outputs a sine digital carrier signal $\sin(2\pi fct+c)$ with a phase lag of c with respect to the sine digital carrier signal $\sin(2\pi fct)$. The sine digital carrier signal $\sin(2\pi fct+c)$ is converted to an analog signal by a D/A converter 67. The output of D/A converter 67 is band-limited by a band pass filter 68, which is output through an output terminal 69.

The sine carrier signal $\sin(2\pi fct+c)$ thus obtained at output terminal 69 is the same signal as the FM modulation output obtained at output terminal 39 in FIGS. 3 and 5. Consequently, it results in that the video signal input to an input terminal 21 is FM modulated.

FIG. 10 shows a band characteristic of band pass filter 68. As shown in FIG. 10, the band characteristic of band pass filter 41 is preferably selected such that the attenuation amount is $1/(2^n-1)$ or more at a frequency $\pm 4fo$, centered at the carrier frequency fo and the frequency in the range $\pm\frac{1}{2}fo$ is allowed to pass satisfactorily.

In addition, a phase characteristic of a band pass filter 68 is preferably selected such that a phase lag characteristic maintains a linear characteristic as shown in FIG. 11 in the frequency range of $\pm(\frac{1}{2}fo)$, centered at the carrier frequency fo.

The above-described phase resolutions of the sine digital carrier signal $\sin(2\pi fct)$ and the cosine digital carrier signal $\cos(2\pi fct)$ input to first and second digital multipliers 61 and 62 depend on the bit arrangements and first and second digital multipliers 61 and 62, respectively. Assuming that each of first and second digital multipliers 61 and 62 comprises 10 bits, for example, the phase resolution is 0.35° (=360°÷1023). In the embodiment of FIG. 6, the relation between a minimum phase change dc and a frequency change df per unit time will be expressed by the following equation (14).

$$df=(\tfrac{1}{2}\pi)(dc/dt) \qquad (14)$$

The relation between a minimum phase change dc and a maximum frequency deviation $\Delta f$ per unit time will be therefore expressed by the following equation (15).

$$\Delta f = df(2^8-1) \qquad (15)$$

Thus, when, $$dc = 6.14\times 10^{-3} \text{ rad} \qquad (16)$$

$$dt = 400 \text{ nsec } (=1/fc=2.5 \text{ MHz}) \qquad (17),$$

it can be shown as follows, $$\Delta f = 0.623 \text{ MHz} \qquad (18)$$

$$df = 2443 \text{ Hz} \qquad (19)$$

so that a completely linear relation is established between the input voltage and the output frequency. That is, it has a linear characteristic.

The embodiment of FIG. 6 shows a case where the carrier frequency fc is set to 2.5 Mz which corresponds to a synchronization signal tip level of a video signal and the maximum frequency deviation $\Delta f$ is set to 0.623

MHz so that a frequency is modulated to become higher.

Figure 12:
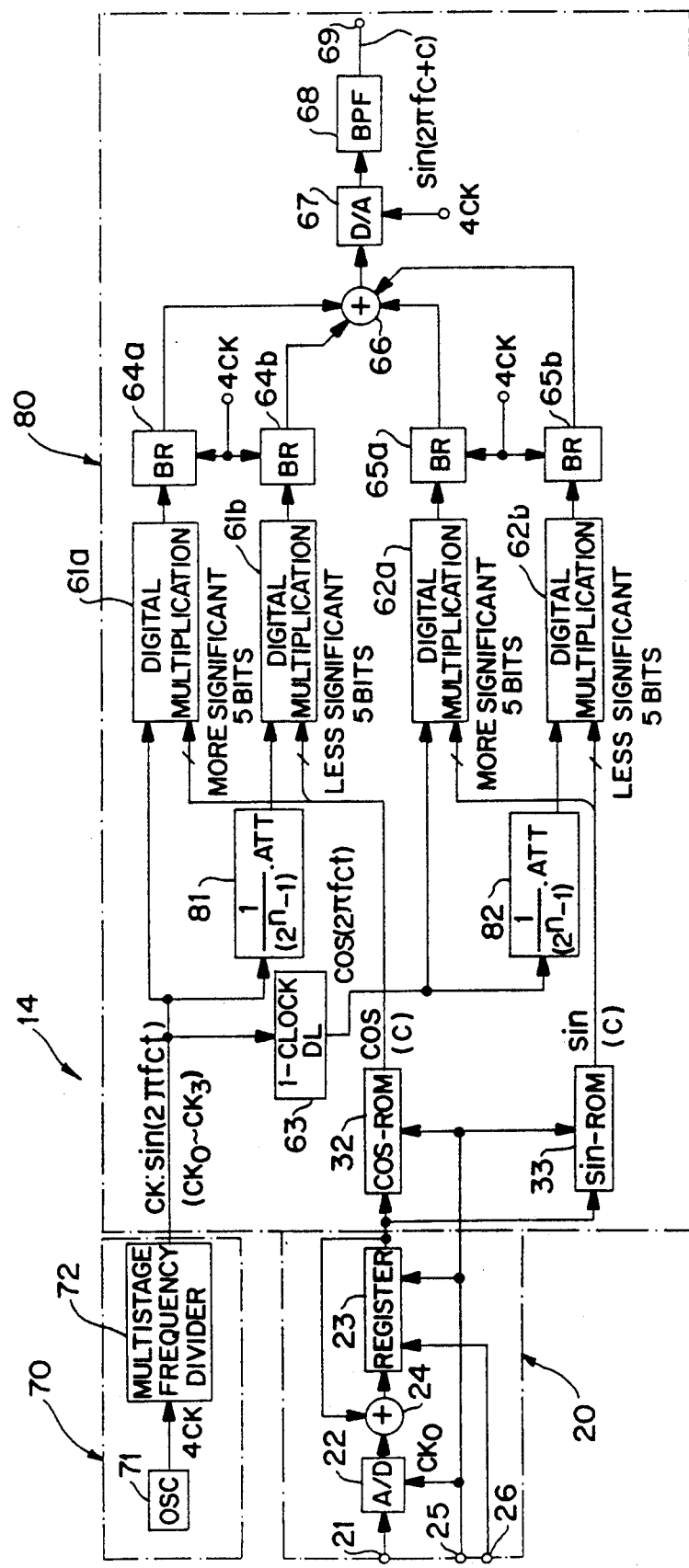
FIG. 12 is the block diagram showing the arrangement of the fourth embodiment of the present invention.

FIG. 12 is the block diagram showing the arrangement of the fourth embodiment of the present invention. An FM modulator 14 shown in FIG. 12 has the same arrangement as that of FM modulator 13 shown in FIG. 6 except for the following points and the same reference numerals are allotted to the corresponding parts and therefore no description will be made thereof.

In the drawing, FM modulator 14 comprises a multiplication circuit 20, a phase modulating circuit 80 and a carrier signal generating circuit 70. The arrangement of phase modulating circuit 80 is a little different from that of phase modulating circuit 60 shown in FIG. 6. A phase modulating circuit 82 is provided with four digital multipliers 61a, 61b, 62a and 62b each comprising 5 bits. Digital multiplier 61a receives the most significant 5 bits of the cosine digital video signal cos(c) and the sine digital carrier signal sin($2\pi$fct). Digital multiplier 61b receives the least significant 5 bits of the cosine digital video signal cos(c) and the sine digital carrier signal sin($2\pi$fct) attenuated by an attenuator 81. Digital multiplier 62a receives the most significant 5 bits of the sine digital video signal sin(c) and the cosine digital carrier signal cos($2\pi$fct). Digital multiplier 62b receives the least significant 5 bits of the sine digital video signal sin(c) and the cosine digital carrier signal cos($2\pi$fct) attenuated by an attenuator 82. Attenuator 81 attenuates the level of the sine digital video signal sin($2\pi$fct) to $1/(2n-1)$. Similarly, attenuator 82 attenuates the level of the cosine digital carrier signal cos($2\pi$fct) to $\frac{1}{2}n-1$. The outputs of digital multipliers 61a and 61b are applied to a digital adder 66 through buffer registers 64a and 64b. The outputs of digital multipliers 62a and 62b are applied to digital adder 66 through buffer registers 65a and 65b, respectively.

When a maximum amplitude of a digital carrier signal is resolved by n bits, for example, 5 bits, the minimum resolution width becomes $1/(2^5-1)$ of the maximum amplitude of the digital carrier signal. Therefore, it results in that the minimum resolution width of digital multiplier 61a is further resolved by 5 bits by means of attenuator 81 and digital multiplier 61b. As a result, the pair of digital multipliers 61a and 61b and attenuator 81 as a whole function as a digital multiplier of 2n bits. Similarly, the pair of digital multipliers 62a and 62b and attenuator 82 as a whole function as a digital multiplier of 2n bits. Thus, phase modulating circuit 80 has the same function as that of phase modulating circuit 60 shown in FIG. 6.

As the foregoing, the embodiment shown in FIG. 12 including phase modulating circuit 80 comprised of a digital multiplier of 5 bits can be manufactured at an extremely reduced cost as compared with such phase modulating circuit 60 as shown in FIG. 6 using a digital multiplier comprising 10 bits.

Since a sine wave signal and a cosine wave signal are completely the same signals except that they are out of phase by ¼ cycle, completely the same effect can be obtained even exchanging a sine wave signal and a cosine wave signal in the embodiments shown in FIGS. 6 and 12.

Digital multipliers 61, 62, 61a, 61b, 62a and 62b in the embodiments shown in FIGS. 6 and 12 can be structured to multiply sine waves by each other or cosine waves by each other.

Furthermore, digital adder 66 can perform a subtraction in place of an addition.

While in the embodiments shown in FIGS. 3, 5, 6 and 12, first waveform converting ROM 32 generates a cosine digital video signal cos(c) and second waveform converting ROM 33 generates a sine digital video signal sin(c), it is possible to generate sine and cosine digital video signals by using either first or second waveform converting ROM 32 or 33 because the sine digital video signal sin(c) and the cosine digital video signal cos(c) have the phases orthogonal to each other.

As the foregoing, the FM modulator according to the present invention is suitable for FM modulating an analog signal such as a video signal.

The present invention being thus described, it will be obvious that the same may be varied in many ways. Such variations are not to be regarded as a departure from the spirit and scope of the present invention, and all such modifications as would be obvious to one skilled in the art are intended to be included within the scope of the following claims.

We claim:

1. An FM modulator for FM-modulating an integrated modulation signal by phase-modulation, comprising:
   integration means for converting an analog modulation signal to a digital integration output;
   carrier signal generating means for generating a carrier signal; and
   phase-modulating means for phase-modulating the output of said integration means based on said carrier signal;
   said phase-modulating means including,
   digital modulation signal outputting means for outputting first and second digital modulation signals having phases orthogonal to each other based on the output of said integration means,
   carrier signal converting means for converting said carrier signal to first and second carrier signals having phases orthogonal to each other,
   first converting means for inputting said first digital modulation signal and said first carrier signal and for outputting an analog signal corresponding to a multiplication of the first digital modulation signal and first carrier signal,
   second converting means for inputting said second digital modulation signal and said second carrier signal and for outputting an analog signal corresponding to a multiplication of the second modulation signal and second carrier signal, and
   operation means for adding or subtracting the outputs of said first and second converting means.

2. The FM modulator as claimed in claim 1, wherein said digital modulation signal outputting means comprises:
   first digital modulation signal outputting means for outputting as said first digital modulation signal a digital modulation signal of a cosine function which phase changes in response to the output of said integration means; and
   second digital modulation signal outputting means for outputting as said second digital modulation signal a digital modulation signal of a sine function which phase changes in response to the output of said integration means.

3. The FM modulator as claimed in claim 2, wherein said first digital modulation signal outputting means includes first storing means having a conversion table for converting an input signal to a cosine function, said second digital modulation signal outputting means includes second storing means having a conversion table for converting an input signal to a sine function.

4. The FM modulator as claimed in claim 2, wherein said carrier signal is a sine wave analog signal having a fixed frequency;
said carrier signal converting means includes delay means for converting said sine wave analog signal to a cosine wave analog signal by delaying the sine wave analog signal by ¼ cycle;
said sine wave analog signal being used as said first carrier signal and said cosine wave analog signal being used as said second carrier signal.

5. An FM modulator for FM-modulating an integrated modulation signal by phase-modulation, comprising:
integration means for converting an analog modulation signal to a digital integration output;
carrier signal generating means for generating a carrier signal; and
phase-modulating means for phase-modulating the output of said integration means based on said carrier signal;
said phase-modulating means including,
digital modulation signal outputting means for outputting first and second digital modulation signals having phased orthogonal to each other based on the output of said integration means,
carrier signal converting means for converting said carrier signal to first and second carrier signal having phases orthogonal to each other,
first converting means for inputting said first digital modulation signal and said first carrier signal and for outputting an analog signal corresponding to a multiplication of the first digital modulation signal and first carrier signal,
second converting means for inputting said second digital modulation signal and said second carrier signal and for outputting an analog signal corresponding to a multiplication of the second modulation signal and second carrier signal, and
operation means for adding or subtracting the outputs of said first and second converting means;
said first and second digital modulation signals each having a m bit signal, m being not less than 2;
said first and second digital modulation signals being divided into a first group comprising bits from a most significant bit to k (m<k) bit and a second group comprising bits from k+1 bit to a least significant bit;
said phase modulating means including,
first attenuating means for attenuating said first carrier signal by a predetermined amount, and
second attenuating means for attenuating said second carrier signal by a predetermined amount;
said first converting means including,
first higher digits converting means for outputting an analog signal corresponding to a multiplication said first group of said first digital modulation signal and said first carrier signal, and
first lower digits converting means for outputting an analog signal corresponding to a multiplication of said second group of said first digital modulation signal and said first carrier signal attenuated by said first attenuating means;
said second converting means including, second higher digits converting means for outputting an analog signal corresponding to a multiplication of said first group of said second digital modulation signal and said second carrier signal, and
second lower digits converting means for outputting an analog signal corresponding to a multiplication of said second group of said second digital modulation signal and said second carrier signal attenuated by said second attenuating means;
said operation means adding the output of said first higher digits converting means, the output of said first lower digits converting means, the output of said second higher digits converting means, and the output of said second lower digits converting means.

6. An FM modulator for FM-modulating an integrated modulation signal by phase-modulating the same, comprising:
integration means for converting an analogue modulation signal to a digital integration output,
digital carrier signal group generating means for generating a digital carrier signal group including four digital carrier signals out of phase by $\pi/2$ to one another, and
phase-modulating means for phase-modulating the output of said integration means based on said digital carrier signal group, said phase-modulating means including:
digital modulation signal outputting means for outputting first and second digital modulation signals having phases orthogonal to each other based on the output of said integration means,
digital carrier signal group converting means for converting said digital carrier signal group to a first digital carrier signal group and a second digital carrier signal group having phases orthogonal to each other,
first multiplication means for multiplying said first digital modulation signal by said first digital carrier signal group,
second multiplication means for multiplying said second digital modulation signal by said second digital carrier signal group, and
operation means for adding or subtracting the outputs of said first and second multiplication means.

7. The FM modulator according to claim 6, wherein said digital modulation signal outputting means includes:
first digital modulation signal outputting means for outputting as said first digital modulation signal a digital modulation signal of a cosine function which phase changes in response to the output of said integration means, and
second digital modulation signal outputting means for outputting as said second digital modulation signal a digital modulation signal of a sine function which phase changes in response to the output of said integration means.

8. The FM modulator according to claim 7, wherein said first digital modulation signal outputting means includes first storing means having a conversion table for converting an input signal to a cosine function, and
said second digital modulation signal outputting means includes a second storing means having a conversion table for converting an input signal to a sine function.

9. The FM modulator according to claim 7, wherein said carrier signal converting means includes delaying means for delaying said carrier signal group by ¼ cycle,
said digital carrier signals before being delayed by said delaying means are used as said first digital carrier signal group and said digital carrier signal group delayed by said delaying means is used as said second digital carrier signal group.

10. The FM modulator according to claim 6, wherein said phase modulating means further includes D/A converting means for converting the output of said operation means to an analogue signal.

* * * * *